United States Patent
Brule

(10) Patent No.: US 6,583,636 B2
(45) Date of Patent: Jun. 24, 2003

(54) BGA ON-BOARD TESTER

(75) Inventor: David Alan Brule, Riverside, RI (US)

(73) Assignee: Delaware Capitol Formation, Wilmington, DE (US)

( * ) Notice: Subject to any disclaimer, the term of this patent is extended or adjusted under 35 U.S.C. 154(b) by 80 days.

(21) Appl. No.: 09/851,490

(22) Filed: May 8, 2001

(65) Prior Publication Data

US 2001/0052782 A1 Dec. 20, 2001

Related U.S. Application Data

(60) Provisional application No. 60/203,664, filed on May 12, 2000.

(51) Int. Cl.[7] .............................................. G01R 31/02
(52) U.S. Cl. ...................... 324/755; 324/158.1; 324/754
(58) Field of Search .............................. 324/754, 158.1, 324/755, 763, 757, 758; 438/83, 70, 71, 74; 439/66, 482

(56) References Cited

U.S. PATENT DOCUMENTS

| | | | |
|---|---|---|---|
| 5,498,970 A | | 3/1996 | Petersen ...................... 324/755 |
| 5,859,538 A | * | 1/1999 | Self ............................ 324/755 |
| 6,064,214 A | * | 5/2000 | Self ............................ 324/754 |
| 6,084,421 A | | 7/2000 | Swart et al. ................. 324/755 |
| 6,394,820 B1 | * | 5/2002 | Palaniappa et al. ........... 439/83 |

* cited by examiner

Primary Examiner—Kamand Cuneo
Assistant Examiner—Jimmy Nguyen
(74) Attorney, Agent, or Firm—Christie, Parker & Hale, LLP

(57) ABSTRACT

An on-board tester (referred to as a "test fixture") for testing integrated circuit chips, particularly ball grid array (BGA) chips. The test fixture of the present invention eliminates many of the problems associated with presently available test fixtures, particularly the lack of control in mounting the chips to the test fixture, and the unpredictable testing results. The present test fixture has an upper assembly and a lower assembly. A circuit board containing the BGA chip to be tested is mounted between the upper and lower assemblies. The lower assembly has guide pins extending toward the upper assembly which allows any circuit board having alignment holes that match the configuration of the guide pins to be mounted to the lower assembly. Moreover, the present test fixture has a unique latching mechanism which uses rotational movement to latch and unlatch the test fixture. Particularly, a collet assembly is used which allows rotation of a shaft to compress other plates in the assembly so that the upper and lower assembly are properly secured together. Rotational movement is also used to secure the test pins of the test fixture to the BGA chip. The test fixture has a knob that is rotated to linearly draw the upper and lower assemblies together until the probe test pins have an effective electrical connection with the BGA chip.

15 Claims, 5 Drawing Sheets

BGA ON-BOARD TESTER

CROSS-REFERENCE TO RELATED APPLICATIONS

This application claims priority of Provisional Patent Application No. 60/203,664 filed May 12, 2000.

FIELD OF THE INVENTION

This invention relates to test fixtures, particularly on-board testers, for integrated circuit chips, such as a ball grid array (BGA) chip. The on-board tester (referred to herein as the "test fixture") includes an upper assembly and a lower assembly that attach through a circuit board mounted between the upper assembly and lower assembly. The circuit board contains the BGA chip to be tested and an electrical engagement between the test fixture and the BGA chip is achieved by rotational movement that linearly compresses probe test pins of the lower assembly against the BGA chip.

BACKGROUND OF THE INVENTION

Testing of integrated circuits, such as those contained within ball grid array (BGA) packaging, is accomplished through the use of what is commonly referred to in the art as a test fixture. BGA test fixtures typically include a housing mounted to a load board which interfaces with the test electronics. The load board is generally a circuit board for transferring test signals from the integrated circuit in the BGA to the test electronics.

Previous methods of attaching the test fixture to the load board include through hole techniques and surface mounting techniques. In the surface mounting connection, the test fixture includes test pads which make contact with the solder balls on the bottom of the BGA as the BGA is compressed against the test pads to transfer the test signals to the load board. A problem associated with the surface mounting test fixture arrangement is that the solder balls on the bottom of the BGA can vary in height and good electrical contact between each solder ball and the test pad cannot always be assured. A second problem associated with surface mounting is that once the test pads become contaminated from the solder balls, the entire fixture assembly must be replaced.

Through hole techniques for connecting the fixture to the load board include holes drilled through the load board for the passage of spring loaded contact pins which contact the solder balls on the BGA and transfer the test signals to the load board through the contact between the test pins and the holes in the load board. A problem associated with the through hole fixture arrangement is that the test pins extending up through the load board could easily be bent or damaged which would negatively impact the test results. To avoid this problem, a receptacle can be positioned between the fixture and the load board to protect the test pins extending through the load board. The result of incorporating a receptacle requires the length of the test pins in the fixture to be increased which creates a problem for testing high speed integrated circuits. To address this problem spring probes have been incorporated which have a short travel length, however with short travel springs, the spring life is short requiring constant replacement. In addition, the use of spring probes in the fixture can create an impedance problem for the transfer of the test signal from the BGA to the load board.

Consequently, a need exists for a new test fixture for BGA packages which reduces the problems associated with prior art test fixtures. Particularly, a new test fixture that can be easily mounted on a circuit board and produce accurate results.

SUMMARY OF THE INVENTION

The present invention relates to an on-board tester (referred to herein as a "test fixture") for testing integrated circuit chips, particularly ball grid array (BGA) chips. The test fixture of the present invention eliminates many of the problems associated with presently available test fixtures, particularly the lack of control in mounting the chips to the test fixture, and the unpredictable testing results.

The present test fixture has an upper assembly and a lower assembly. A circuit board containing the BGA chip to be tested is mounted between the upper and lower assemblies. The lower assembly has guide pins extending toward the upper assembly which allows any circuit board having alignment holes that match the configuration of the guide pins to be mounted to the lower assembly. This makes the test fixture versatile as compared to many existing test fixtures which have a "clamshell" latching mechanism that will only allow a circuit board having exactly the same dimensional properties as the test fixture to be tested. Moreover, the present test fixture has a unique latching mechanism which uses rotational movement to latch and unlatch the test fixture. Particularly, a collet assembly is used which allows rotation of a shaft to compress other plates in the assembly so that the upper and lower assembly are properly secured together.

The test fixture of the present invention also provides increased testing accuracy by using rotational movement to secure the test pins of the test fixture to the BGA chip. The test fixture has a rotatable knob that is rotated to linearly draw the upper and lower assemblies together until a plurality of probe test pins have an effective electrical connection with the BGA chip. This controlled compression eliminates the problems of previous methods which tend to damage the test pins and provide unpredictable contact with the test pins, and thus produce unreliable results.

DETAILED DESCRIPTION

The test fixture 10 of the present invention is used to test integrated circuit chips that have been mounted to a circuit board 50. In a preferred embodiment, the test fixture 10 is designed to test a ball grid array (BGA) chip 51 that is mounted to the circuit board 50. The novel design of the test fixture 10, however, is equally applicable for testing other types of integrated circuit chips. For clarity, the detailed description will be limited to describing the test fixture 10 as used to test the BGA chip 51 that has been mounted to the circuit board 50.

Figure 1:
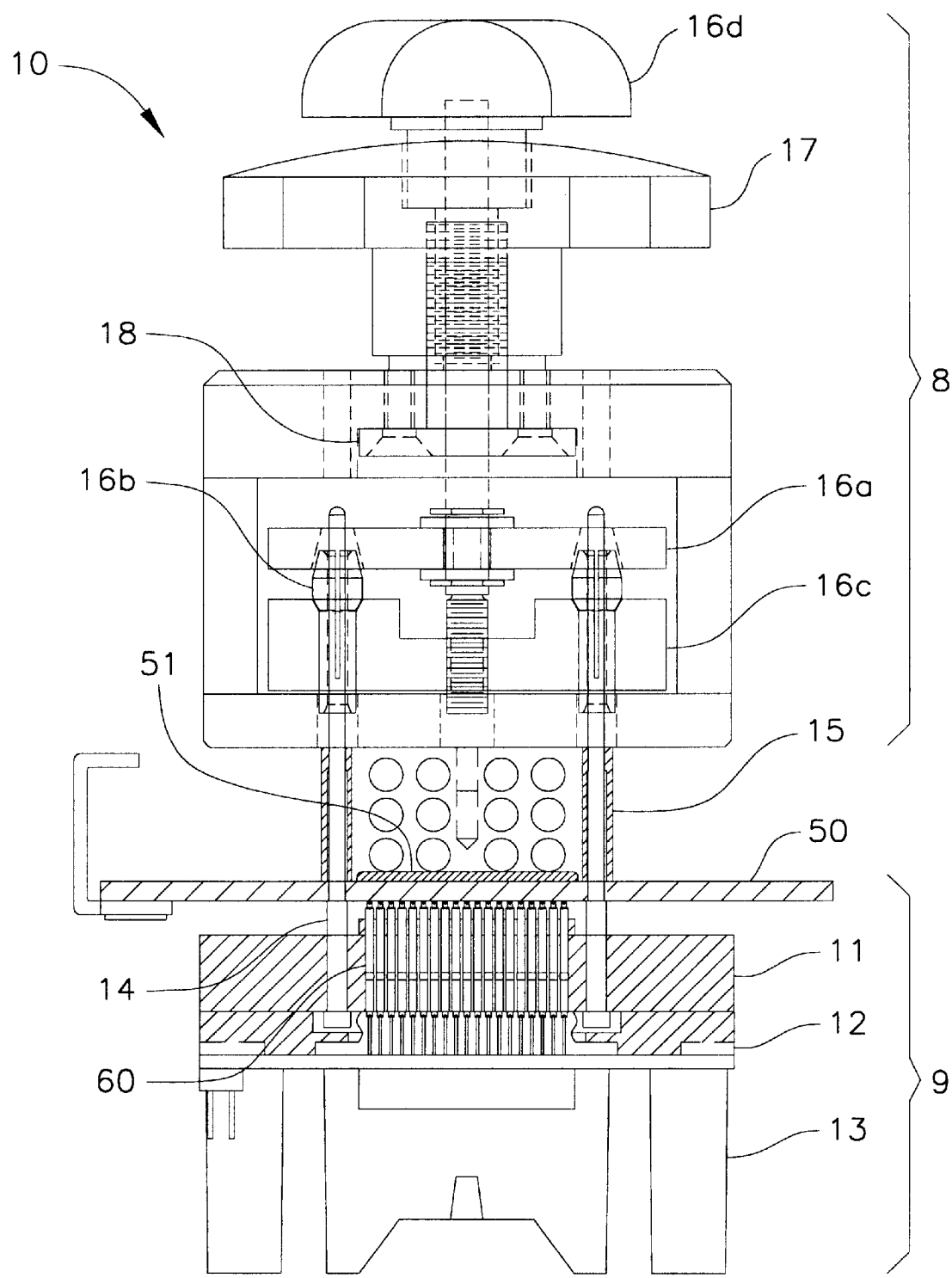
FIG. 1 is a partial cross-sectional side view of a test fixture of the present invention.
Figure 2A:
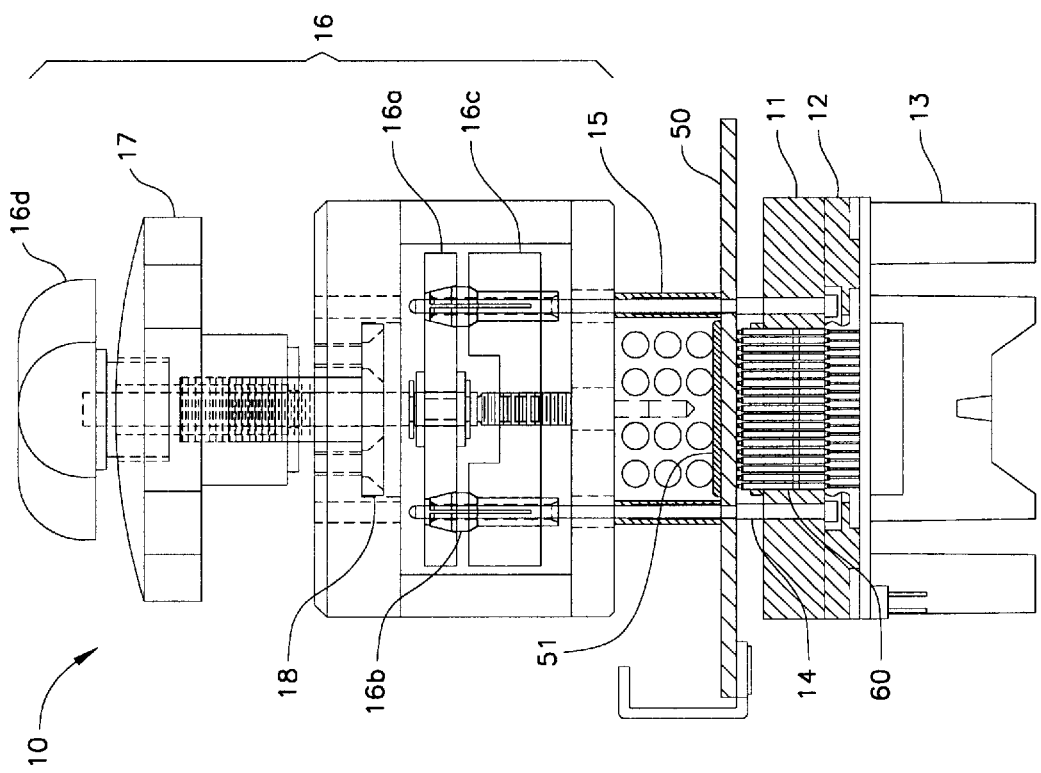
FIGS. 2a and 2b are partial cross-sectional side views of the test fixture of FIG. 1 shown in the assembled, non-actuated position, and the assembled, actuated position respectively.
Figure 2B:
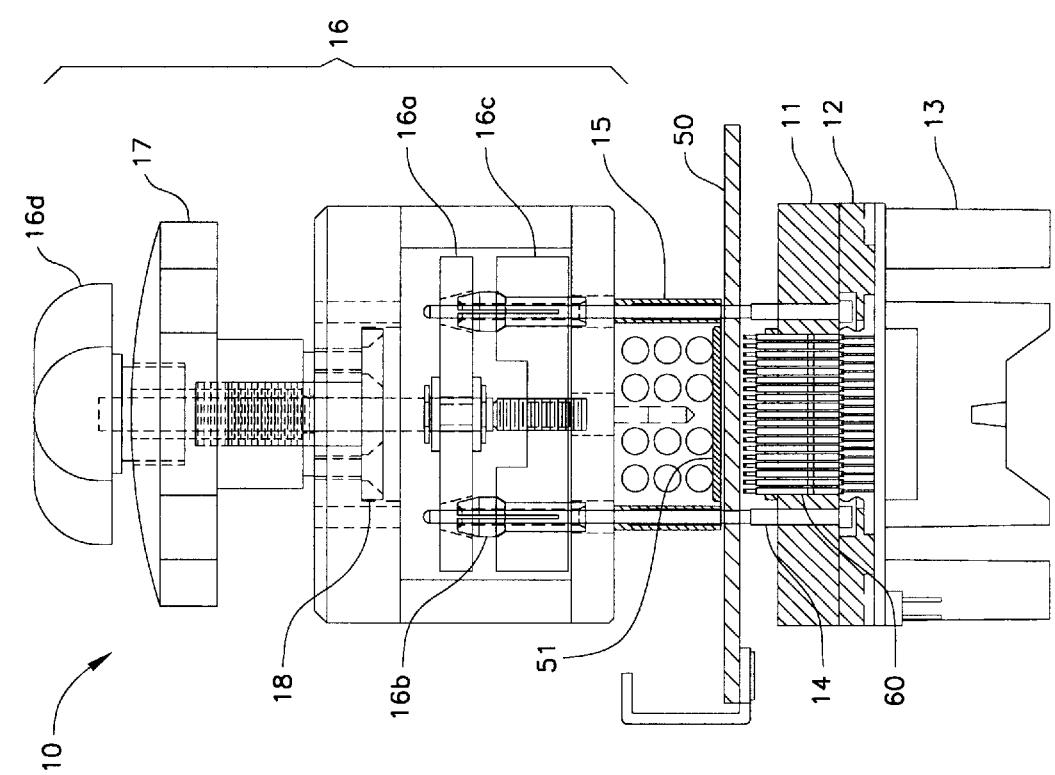

Generally, FIGS. 1, 2a and 2b depict the test fixture 10 during testing of the BGA chip 51. The test fixture 10 includes an upper assembly 8 and a lower assembly 9. When the BGA chip 51 is being tested, the circuit board 50 is placed between the upper assembly 8 and the lower assembly 9. The lower assembly 9 has a plurality of guide pins 14 extending upwardly, and the circuit board 50 having supplied holes is placed over the guide pins 14 until the circuit board 50 rests on the lower assembly. Preferably there are four guide pins 14 arranged in a square pattern. The guide pins 14 extend beyond the circuit board 50, and the upper assembly 8 is then aligned over the guide pins 14 which pass through holes in the upper assembly until the upper assembly is seated on the circuit board 50. The upper assembly 8 and lower assembly 9 are connected by a collet assembly 16 located in the upper assembly. The collet assembly 16 serves to either compresses the upper assembly and lower assembly together, or to separate the connected upper and lower assemblies. When the upper and lower assemblies are connected the test fixture 10 is said to be "latched", and when they are separated the test fixture is "unlatched".

The collet assembly 16 comprises an upper collet plate 16a, a plurality of collets 16b, a lower collet plate 16c, and a rotatable shaft 16d. The upper collet plate is positioned vertically above the lower collet plate 16c, and both the upper and lower collet plates have a plurality of apertures wherein the collets 16b and the rotatable shaft 16d are inserted. The collets 16b are generally disposed between the upper collet plate 16a and the lower collet plate 16c. The rotatable shaft 16d is vertically disposed through apertures in the upper and lower collet plates and has a portion extending above the upper collet plate while being engaged in the lower collet plate. When the collets 16b and the rotatable shaft 16d have been inserted into the upper and lower collet plates, the upper collet plate 16a and lower collet plate 16c are approximately parallel to each other in horizontal relation, and the collets 16b and the rotatable shaft are approximately parallel to each other in vertical relation.

Clockwise rotation of the rotatable shaft 16d draws the lower collet plate 16c towards the upper collet plate 16a, thereby compressing the collets 16b against the guide pins 14, thus making a secure connection between the upper and lower assemblies. At this point, the test fixture is said to be latched. Counterclockwise rotation of the rotatable shaft 16d will loosen the collet assembly 16, thus removing the collets 16b from being disposed over the guide pins 14 and returning the test fixture to the unlatched position.

To test the BGA chip 51, an effective electrical engagement with the BGA chip 51 and the probe test pins 60 of the lower assembly 9 needs to be made. Generally, a rotatable knob 17 is positioned around the rotatable shaft 16d and above the upper collet plate 16a, and clockwise rotation of the rotatable knob 17 draws the lower assembly up toward the upper assembly, thereby creating the necessary electrical engagement. After testing of the BGA chip 51 has been completed, the circuit board 50 is removed from the test fixture 10 by using the same motions as described, but in the reverse order.

Figure 5:
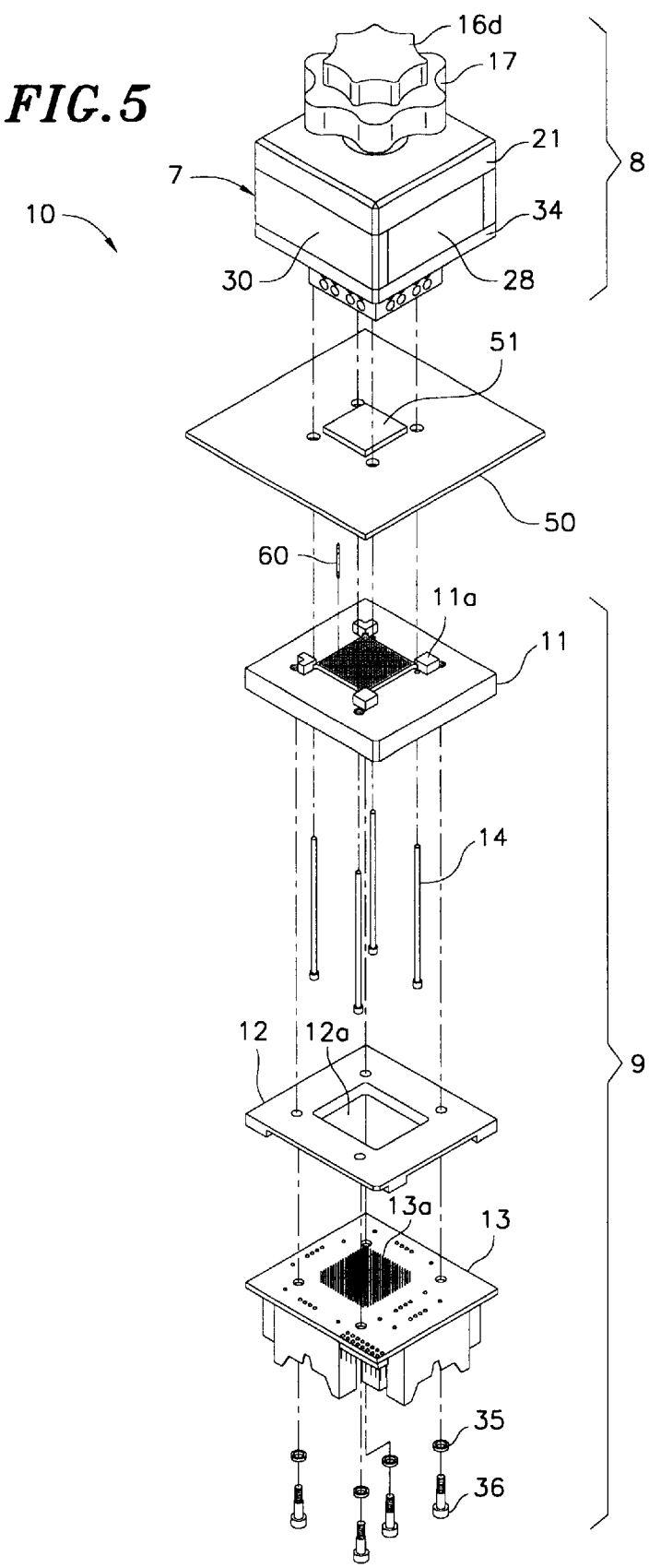
FIG. 5 is an exploded perspective view of the lower assembly and an assembled upper assembly of the test fixture of FIG. 1.

Referring to FIG. 5, the majority of the upper assembly 8 is comprised within a modular frame 7 that is formed by a top plate 21, front plate 30, rear plate 29, two side plates 28, and bottom plate 34. The side plates 28 and front plate 30 and rear plate 29 are connected to each other by a plurality of dowel pins 31. In a preferred embodiment, each of the plates comprising the modular frame 7 are made of aluminum or any other dimensionally stable, strong, machinable material.

Figure 3:
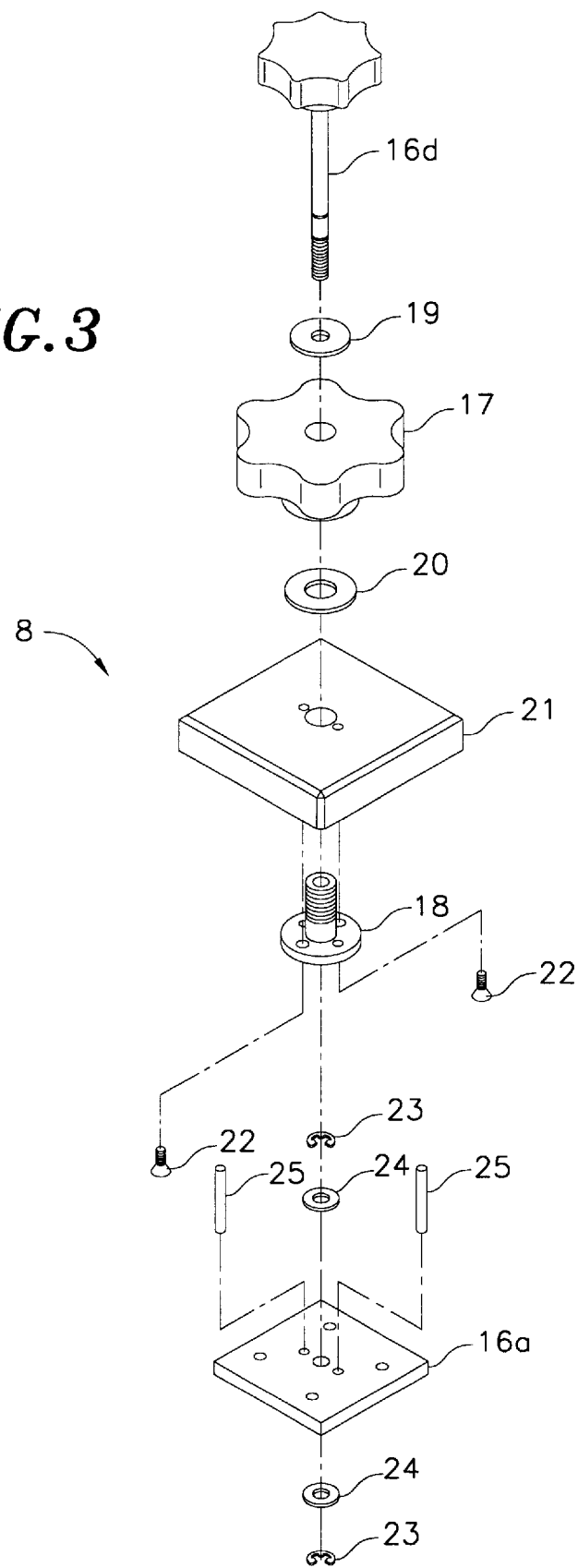
FIG. 3 is an exploded perspective view of a portion of the upper assembly of the test fixture of FIG. 1.

As shown in FIG. 3, a flanged guide 18 passes through the top plate 21 and is attached to the top plate by a plurality of threaded fasteners 22. The flanged guide 18 serves as a linear bearing for the rotatable shaft 16d, as the rotatable shaft passes through a bore in the center of the flanged guide. Further, the flanged guide 18 has a threaded exterior onto which the rotatable knob 17 is threaded. Preferably the flanged guide 18 is formed of phosphorous bronze, but any other material suitable for this purpose can be used.

The rotatable shaft 16d passes through a washer 19, the rotatable knob 17, a washer 20, the center recess of the flanged guide 18, and an accurately placed hole in the top collet plate 16a. The rotatable shaft can be formed from any suitable material that is resistant to corrosion, gauling and the like, such as hardened stainless steel. The upper collet plate 16a is captured on the rotatable shaft 16d by a plurality of snap ring retainers 23. Further, a plurality of washers 24 are placed between the upper collet plate 16a and the snap ring retainers 23. Preferably the washers 19 and 24 are made from black delrin, but any suitable low friction material can be used.

The upper collet plate 16a of the upper assembly 8 preferably has seven accurately placed holes which are adapted to receive four collets 16d, two dowel pins 25, and the rotatable shaft 16d. The two dowel pins 25 are pressed into the upper collet plate 16a and pass through the flanged guide 18 and the top plate 21 and rest against the base of the rotatable knob 17. This configuration keeps the collet assembly 16 captured on the rotatable knob 17, thereby causing the collet assembly 16 to move in direct relation to the vertical position of the rotatable knob 17, which is threaded onto the flanged guide 18.

Figure 4:
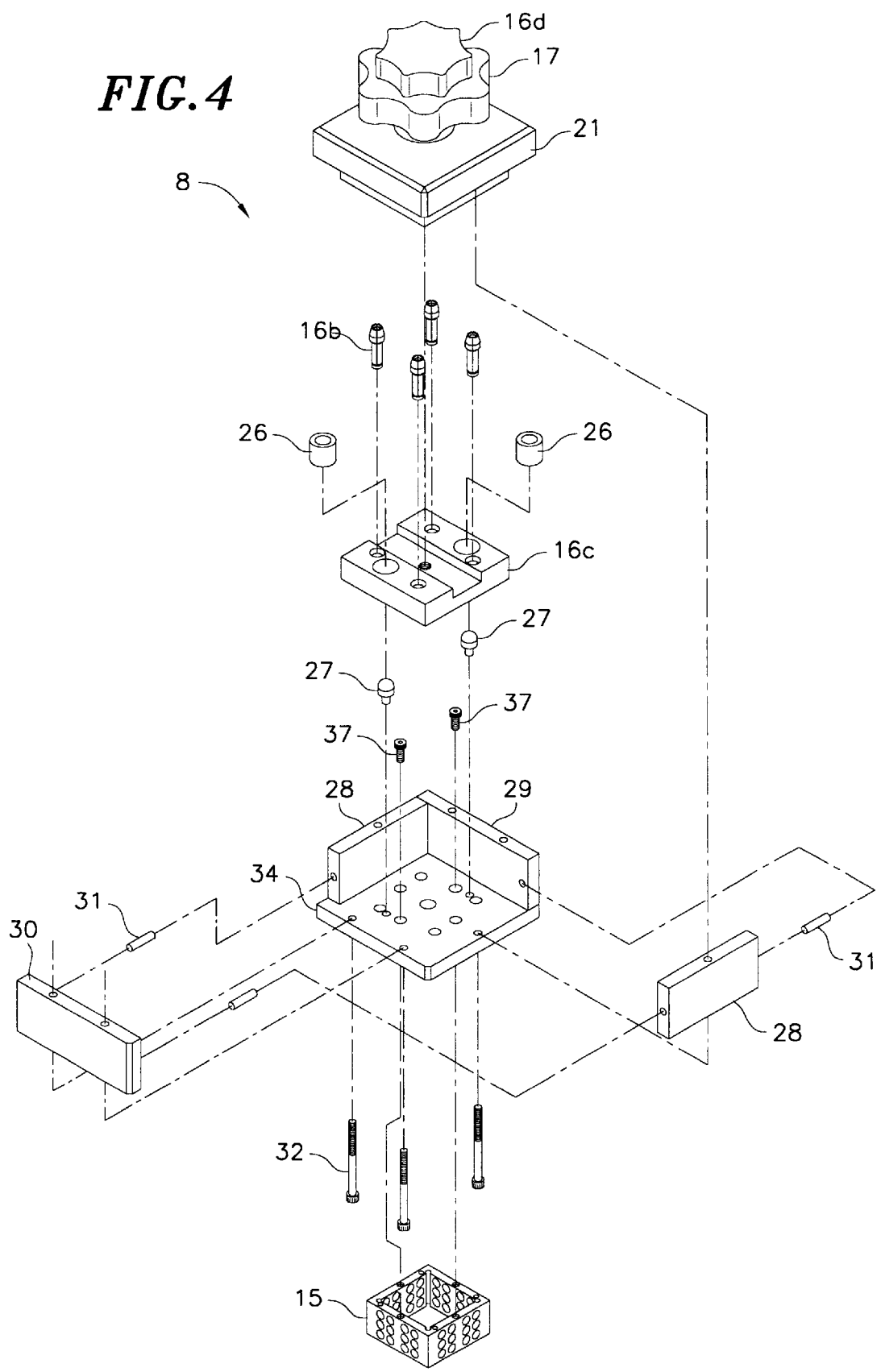
FIG. 4 is an exploded perspective view of the complete upper assembly of the test fixture of FIG. 1.

Referring to FIG. 4, the lower collet plate 16c also has seven accurately placed holes which are adapted to receive the four collets 16b, two drill bushings 26, and the rotatable shaft 16d. The threaded portion of the rotatable shaft 16d is threadingly received within a threaded hole in the lower collet plate 16c. Rotation of the rotatable shaft 16d in a clockwise direction causes the lower collet plate 16c to move upward towards the upper collet plate 16a, which results in the collets 16b being compressed between the upper collet plate 16a and the lower collet plate 16c, thereby "latching" the test fixture 10. As noted above, counterclockwise rotation of the rotatable shaft 16d will loosen the collet assembly and "unlatch" the test fixture.

The lower collet plate 16c and the bottom plate 34 are connected by the two drill bushings 26 and two tooling pins 27. Specifically, the drill bushings 26 are received in bores of the lower collet plate 16c and serve as linear bearings for the tooling pins 27, thereby preventing the lower collet plate 16c from rotating when a rotational force is applied to it by the rotatable shaft 16d. Additionally, the heatsink riser 15 is attached to the bottom plate 34 by threaded fasteners 37. The heatsink riser 15 surrounds the area of the circuit board 50 where the BGA chip 51 is mounted and serves to allow the BGA chip 51 to cool while being tested and provide a protective space between the BGA chip 51 and the test fixture 10.

With respect to the lower assembly 9, it has been noted that positioning the circuit board 50 over the lower assembly 9 is accomplished by placing the circuit board 50 over the guide pins 14. The circuit board 50 has alignment holes that were designed to match the guide pins 14. In a preferred embodiment, the circuit board 50 is manufactured with four alignment holes and the lower assembly 9 has four guide pins 14. It should be noted, however, that any plurality of guide pins 14 (i.e. three guide pins) can be used in the lower assembly so long as the circuit board 50 is manufactured with a matching number of alignment holes.

As shown in FIG. 5, the probe plate 11 is the upper most component of the lower assembly 9. The probe plate 11 has a surface that faces the circuit board 50, which will be deemed a top surface, while the opposite side will be deemed a bottom surface. The probe plate 11 has counter bored holes in which the guide pins 14 are upwardly disposed through the bottom surface of the probe plate, so that the heads of the guide pins 14 are flush against the bottom surface. The guide pins 14 extend through the top surface of the probe plate 11, thereby allowing the alignment holes of the circuit board 50 to be disposed over the guide pins. The probe plate 11 also has an array of accurately drilled holes in which a plurality of probe test pins 60 are mounted.

The probe test pins 60 each comprise a tube shaped body having a spring mounted inside the body and a pair of plungers placed partially inside each end of the body, where a plunger extends from each end of the body. The plungers at each end of the body of the probe test pin 60 press against the spring in such a manner that the probe test pins 60 are considered "spring loaded". When the probe test pins 60 are pressed into the probe plate 11 the desired distance, each probe test pin 60 will have a plunger extending beyond the top and bottom surfaces of the probe plate 11. The plunger extending from the top surface contacts the BGA chip 51 mounted on the circuit board 50, while the plunger at the opposite end of the probe test pin 60 contacts an analyzer card 13. The probe test pins 60 serve to transfer signals that are received from the BGA chip 51 to the analyzer card 13. The analyzer card 13 is connected to appropriate monitoring equipment (not shown) which displays the results from the testing.

A spacer plate 12 is mounted immediately below the probe plate 11, so that the top surface of the spacer plate 12 is adjacent to the bottom surface of the probe plate 11. The spacer plate 12 has a window 12a milled through it that allows a portion of the analyzer card 13, which is positioned immediately below the spacer plate, to be exposed. Specifically, the analyzer card 13 has a plurality of gold fingers 13a which are the portion of the analyzer card that contact the probe test pins 60 and serve to receive the signals being transmitted by the probe test pins. The spacer plate 12 ensures that a proper distance between the probe plate 11 and the analyzer card 13 is maintained. The probe plate 11, spacer plate 12, and analyzer card 13 are all connected by a plurality of should screws 36 and washers 35. Once the probe plate, spacer plate and analyzer card have been connected, the probe test pins 60 and gold fingers 13a be in contact with each other and capable of transfer signals received from the BGA chip 51.

Novel features of the present invention relate to the manner and method by which the BGA chip 51 is positioned for testing in the test fixture 10. The test fixture 10 provides increased reliability and accuracy due to the means of connecting the circuit board 50 with the lower assembly 9 and upper assembly 8, and the controlled contact created between the probe test pins 60 and the BGA chip 51. In addition, the test fixture 10 exhibits increased efficiency and flexibility over conventional test fixtures due to its compact size and weight.

The use of the guide pins 14 to mount the circuit board 50 to the lower assembly 9 allows the test fixture 10 to be used with any circuit board that has alignment holes that correspond to the guide pins 14. This method of testing the BGA chip 51 eliminates many of the problems associated with conventional testing fixtures that use a "clamshell" latching mechanism. Alignment of the circuit board 50 with the test fixture 10 is accurate and consistent. Unlike the "clamshell" approach which can only be used with circuit boards having exactly the same dimensional properties as the testing fixture, the test fixture 10 of this invention can be used with any size circuit board. Moreover, the test fixture 10 uses rotational movement connect the circuit board 50 to the lower assembly 9 in a manner that will not damage the probe test pins 60 and ensures accurate testing of the BGA chip 51.

The contact required between the BGA chip and the probe test pins 60 is achieved by a unique design that uses rotational movement to produce linear motion. The upper assembly and lower assembly are "latched" and "unlatched" by the collet assembly 16, which uses rotational movement of the rotatable shaft 16d to compress the upper and lower collet plates together which results in the collets 16b being compressed onto the guide pins 14. The upper assembly 8 and lower assembly 9 are drawn together to create contact between the probe test pins 60 and the BGA chip 51 by rotation of the rotatable knob 17. Most conventional test fixtures achieve linear motion by using cams, vacuums or air pressure. The use of rotational movement to achieve linear motion, however, has several advantages including an improved mechanical advantage (torque), it requires less parts than conventional test fixtures, and it ensures an effective electrical engagement between the test fixture 10 and the BGA chip 51 because the compression is accurately controlled.

Although the present invention has been described and illustrated with respect to preferred embodiments thereof, it is to be understood that it is not to be so limited because changes and modifications maybe made which are within the full intended scope of this invention as hereinafter claimed.

What is claimed is:

1. A test fixture for testing an integrated circuit chip mounted on a circuit board comprising:

an upper assembly;

a lower assembly;

a plurality of guide pins extending from a top surface of the lower assembly, wherein the circuit board is aligned over the guide pins to mount the circuit board to the lower assembly, and the upper assembly is aligned over the guide pins so that the circuit board is mounted between the upper assembly and lower assembly;

a rotatable shaft disposed through the upper assembly for connecting the upper assembly and lower assembly when the circuit board is mounted between the upper and lower assemblies;

a rotatable knob located in the upper assembly which when rotated moves the lower assembly in a linear direction towards the circuit board for creating an electrical connection between the integrated circuit chip and a plurality of test pins positioned in the lower assembly.

2. The test fixture of claim 1 wherein the upper assembly comprises:

a collet assembly, having an upper collet plate positioned vertically above a lower collet plate, a plurality of collets positioned between the upper collet plate and the lower collet plate, and the rotatable shaft is disposed through the upper collet plate and the lower collet;

the rotatable knob is positioned around the rotatable shaft and positioned above the upper collet plate; and a flanged guide having a threaded exterior and a bore, wherein the rotatable knob is threaded onto the threaded exterior of the flanged guide and the rotatable shaft passes through the bore of the flanged guide.

3. The test fixture of claim 2 wherein the lower assembly comprises:

a probe plate having counterbored holes wherein the guide pins are upwardly disposed through a bottom surface of the probe plate and extend beyond a top surface of the probe plate;

the plurality of test pins are mounted through holes in the probe plate, wherein each test pin has a tube shaped body with a spring mounted inside the body and a plunger at each end of the body, wherein the plungers extend beyond the top surface and the bottom surface of the probe plate; and an analyzer card positioned below the probe plate wherein the analyzer card contacts the test pins.

4. The test fixture of claim 1 wherein there are four guide pins.

5. A method for testing an integrated circuit chip in a test fixture, comprising the steps of:

aligning a circuit board containing the integrated circuit chip over a plurality of guide pins extending from a top surface of a lower assembly of the test fixture;

aligning an upper assembly of the test fixture over the guide pins, so that the circuit board will be mounted between the upper assembly and lower assembly;

rotating a shaft disposed through the upper assembly to compress the upper assembly against the guide pins;

rotating a knob positioned on the upper assembly to draw the lower assembly linearly upward so that a plurality of test pins positioned in the lower assembly make electrical contact with the integrated circuit chip; and transmitting a test signal from the test pins to an external monitoring device.

6. The method of claim 5 wherein the upper assembly comprises a collet assembly having an upper collet plate positioned vertically above a lower collet plate, a plurality of collets positioned between the upper collet plate and the lower collet plate, and the shaft is disposed through the upper collet plate and the lower collet.

7. The method of claim 6 wherein rotating the shaft compresses the collets onto the guide pins.

8. The method of claim 6 wherein the knob positioned on the upper assembly is threaded onto a flanged guide, wherein the flanged guide has the shaft disposed through its center.

9. The method of claim 6 wherein the lower assembly comprises:

a probe plate having counter bored holes wherein the guide pins are upwardly disposed through a bottom surface of the probe plate and extend beyond a top surface of the probe plate;

the plurality of test pins are mounted through holes in the probe plate, wherein each test pin has a tube shaped body with a spring mounted inside the body and a plunger at each end of the body, wherein the plungers extend beyond the top surface and the bottom surface of the probe plate; and an analyzer card positioned below the probe plate wherein the analyzer card contacts the test pins.

10. The method of claim 6 wherein the test signal is transmitted to an external monitoring device by an analyzer card in the lower assembly which contacts the test pins and receives signals transmitted from the test pins.

11. A test fixture for testing an integrated circuit chip mounted on a circuit board having an upper assembly and a lower assembly, the test fixture comprising:

means for positioning the integrated circuit chip between the upper assembly and the lower assembly;

means in the upper assembly for translating rotational movement into linear motion for connecting the upper assembly and the lower assembly, while the integrated circuit chip is positioned there between;

means on the upper assembly for translating rotational movement into linear motion for electrically connecting a plurality of test pins positioned in the lower assembly to the integrated circuit chip by drawing the lower assembly towards the upper assembly.

12. The test fixture of claim 11 wherein the means for positioning the integrated chip between the upper assembly and lower assembly includes a plurality of guide pins extending from a top surface of the lower assembly, wherein the circuit board is aligned over the guide pins to mount the circuit board to the lower assembly, and the upper assembly is aligned over the guide pins.

13. The test fixture of claim 12 wherein the upper assembly comprises:

a collet assembly, having an upper collet plate positioned vertically above a lower collet plate, a plurality of collets positioned between the upper collet plate and the lower collet plate, and a shaft disposed through the upper collet plate and the lower collet;

a knob positioned around the shaft and positioned above the upper collet plate;

a flanged guide having a threaded exterior and a through bore, wherein the knob is threaded onto the threaded exterior of the flanged guide and the shaft passes through the through bore of the flanged guide; and the lower assembly comprises:

a probe plate having counterbored holes wherein the guide pins are upwardly disposed through a bottom surface of the probe plate and extend beyond a top surface of the probe plate;

the plurality of test pins are mounted through holes in the probe plate, wherein each test pin has a tube shaped body with a spring mounted inside the body and a plunger at each end of the body, wherein the plungers extend beyond the top surface and the bottom surfaces of the probe plate; and an analyzer card positioned below the probe plate wherein the analyzer card contacts the test pins.

14. The test fixture of claim 13 wherein the means in the upper assembly for translating rotational movement into linear motion is the shaft which when rotated draws the lower collet plate upward towards the upper collet plate and compresses the collets onto the guide pins.

15. The test fixture of claim 13 wherein the means on the upper assembly for translating rotational movement into linear motion is the knob which when rotated draws the lower assembly linearly upward towards the upper assembly and creates an electrical connector between the test pins and the integrated circuit chip.

* * * * *

UNITED STATES PATENT AND TRADEMARK OFFICE
CERTIFICATE OF CORRECTION

PATENT NO. : 6,583,636 B2
DATED : June 24, 2003
INVENTOR(S) : David Alan Brule

It is certified that error appears in the above-identified patent and that said Letters Patent is hereby corrected as shown below:

<u>Column 6,</u>
Line 10, insert -- to -- between "movement connect"

<u>Column 7,</u>
Line 42, insert -- plate -- after "collet" (2nd occurrence)

<u>Column 8,</u>
Line 30, insert -- plate -- after "collet"
Line 48, change "surfaces" to -- surface --
Line 60, change "connector" to -- connection --

Signed and Sealed this

Seventeenth Day of August, 2004

JON W. DUDAS
*Acting Director of the United States Patent and Trademark Office*